United States Patent [19]
Mahieux

[11] Patent Number: 5,311,549
[45] Date of Patent: May 10, 1994

[54] METHOD AND SYSTEM FOR PROCESSING THE PRE-ECHOES OF AN AUDIO-DIGITAL SIGNAL CODED BY FREQUENCY TRANSFORMATION

[75] Inventor: Yannick Mahieux, Begard, France

[73] Assignee: France Telecom, France

[21] Appl. No.: 855,535

[22] Filed: Mar. 23, 1992

[30] Foreign Application Priority Data

Mar. 27, 1991 [FR] France ................... 91 03715

[51] Int. Cl.$^5$ .................................. H04B 14/04
[52] U.S. Cl. ........................ 375/25; 375/122; 341/200; 341/65
[58] Field of Search ............ 375/122, 25, 26; 381/31; 358/133; 341/200, 65

[56] References Cited

U.S. PATENT DOCUMENTS 5,079,621 1/1992 Daly et al. ............. 358/133 X

OTHER PUBLICATIONS

Proceedings of the 25th IEEE Conference on Decision & Control: Dec. 1986, New York (US); pp. 116–112, Lindquist: "Use of Signal Processing Algorithms in microprocessor–based control".
Jayant & Noll, "Digital Coding of Waveforms" 1984. Prentice Hall, Englewood Cliffs (US).

*Primary Examiner*—Curtis Kuntz
*Assistant Examiner*—Tesfaldet Bocure
*Attorney, Agent, or Firm*—Larson and Taylor

[57] ABSTRACT

A method and a system process the pre-echoes of an audio-digital signal coded by frequency transformation. The method and the system, after transforming the signal by a frequency transform into transform coefficients y(k), over weighting windows formed over blocks of samples x(n) including N successive samples, and then quantizing the transform coefficients y(k), make it possible to perform, after decoding the transform coefficients y(k), an optimal filtering of KALMAN filtering type. When a transition in amplitude of the signal is present in the sample block, this KALMAN filter reduces the resulting additive noise arising from the quantization coding of the transform coefficients. The method and system may be used in the processing, storage and transmission of high-fidelity quality audio digital signals.

10 Claims, 6 Drawing Sheets

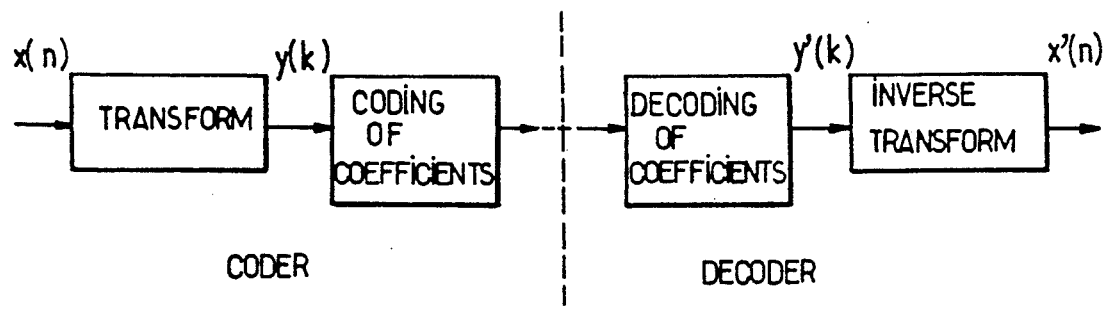
FIG. 1a (PRIOR ART)
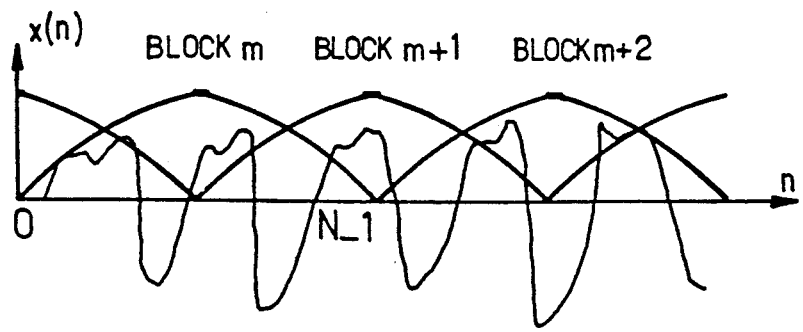
FIG. 1b (PRIOR ART)
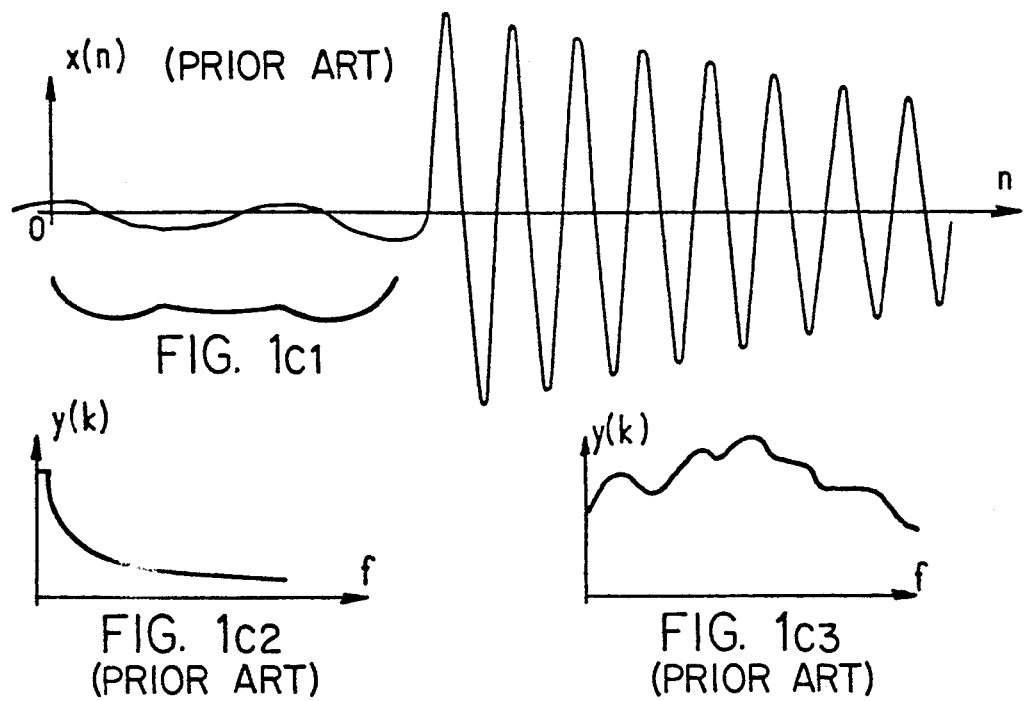
FIG. 1c1
FIG. 1c2 (PRIOR ART)
FIG. 1c3 (PRIOR ART)

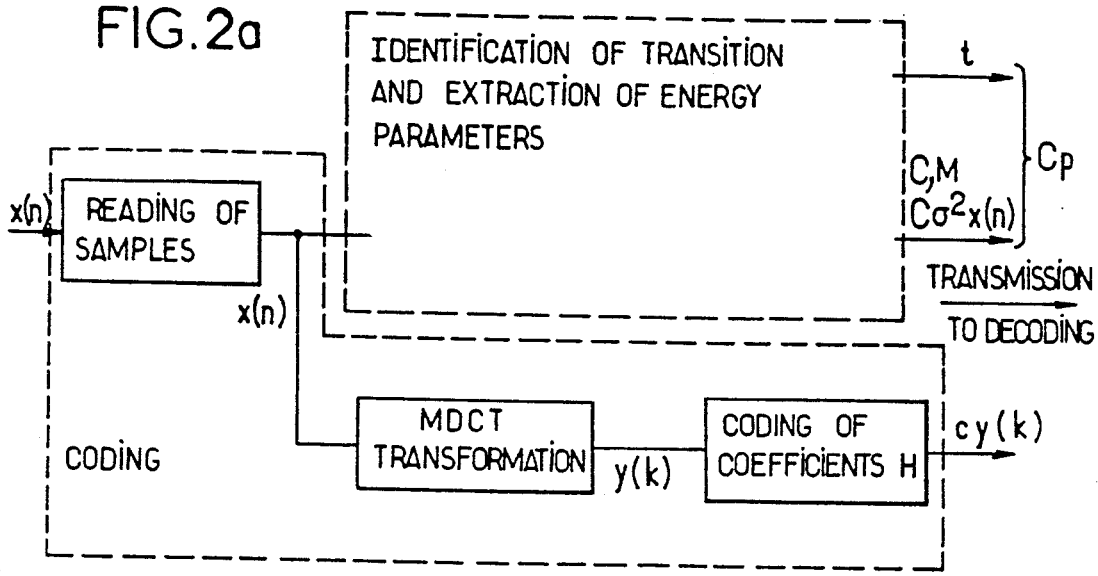

METHOD AND SYSTEM FOR PROCESSING THE PRE-ECHOES OF AN AUDIO-DIGITAL SIGNAL CODED BY FREQUENCY TRANSFORMATION

FIELD OF THE INVENTION

The invention relates to a method and system for processing the preechos of an audio-digital signal coded by frequency transformation.

BACKGROUND OF THE INVENTION

The procedures for storing, transmitting or processing digitized sound signals, used increasingly these days, come up against the problem of the ever more sizeable throughput required depending on the applications envisaged.

Very elaborate techniques, such as the coding of these signals by frequency transform, such as the modified discrete cosine transform, MDCT, are used to reduce the resulting data throughput, whilst substantially preserving the quality of the original signal. Thus, as has been represented illustratively in FIGS. 1a and 1b, the coding by transform proceeds by partitioning the time signal, succession of samples x(n), into blocks comprising N samples. Over each of the abovementioned blocks, after applying an amplitude—time weighting window, such as the window-of block m over the samples 0 to N-1 as represented in FIG. 1b, these windows being repeated with an overlap over N/2 samples, a time/frequency transform is applied to the block of samples thus weighted, to obtain a set of coefficients y(k) which are then coded and then transmitted with the throughput reduction sought, as indicated in FIG. 1a.

On decoding, an inverse transformation is applied to the received coefficients y'(k), this permitting regeneration of the original samples x'(n) in real time, to within coding-decoding processing time and transmission time. It will however be noted that several types of frequency transform may be used, the MDCT transform making it possible however to obtain the largest throughput reduction. For a more detailed description of this type of processing, reference can be made for example to the publications by Johnston "Transfer Coding of Audio Signals Using Perceptual Noise Criteria" IEEE Journal on selected Areas in Communications, Vol. 6, No. 2, February 1988, pp. 314–323, and by Princen and Bradley "Adaptive Transform Coding incorporating Time Domain Aliasing Cancellation" Speech communication, December 1987.

In frequency transform coding systems, the coding noise resulting from the digitizing of the coefficients is distributed uniformly throughout the duration of the sample block.

When this block contains a non-stationarity, such as a sudden excitation, like the one represented in FIG. 1b, the frequency spectrum of the signal, that is to say the distribution, as a function of frequency f, of the amplitude of the coefficients y(k) obtained after. frequency transform, is almost flat, as shown in FIGS. 1C2 and 1C3.

Furthermore, the abovementioned coding algorithms generally carry out a spectral shaping of the noise (cf. abovementioned publication by Johnston) and, even in regard to the block containing a transition, such as mentioned earlier, the spectrum of the noise is almost flat and constant in level throughout-the duration of the block.

Accordingly, for the part preceding the excitation, the spectrum of the noise is clearly greater than that of the signal. This is reflected in the time domain, as represented in FIGS. 1d and 1e relating to an original signal x(n) from a vibraphone excitation sampled at 32 KHz, and to a corresponding signal decoded and then subjected to an inverse transform x'(n) at 64 KBITS/Sec, respectively, by the appearance of a very large degradation called pre-echo.

Furthermore, when the coding system uses the MDCT transform, the two blocks preceding the transition are, owing to the overlap of N/2 samples between successive windows, affected by the pre-echo phenomenon.

Various processing methods have been proposed in order to reduce or eliminate the pre-echo phenomenon.

Among these can be cited the method advocated by Schroeder, described in the article entitled "Stereo Coding with CD quality" International Conference on Consumer Electronics, Chicago 1987 and by Sugiyama, described in the article "Adaptive Transform Coding with an adaptive Block Size", Proceedings of ICASSP 90, Albuquerque pp 1093–1096. In the abovementioned method, a scale factor is applied to the sample block before transformation, so as to reduce the difference in level before and after the transition generated by the excitation. The application of the inverse scale factors to the decoding makes it possible to reduce the noise level in the low energy zones and hence the amplitude, whence the corresponding reduction in the pre-echo phenomenon. However, such a method cannot validly be used when the frequency transform is an MDCT transform, it not being possible to reconstruct the signal perfectly, in the absence of coding, owing to the very presence of the scale factors.

SUMMARY OF THE INVENTION

The subject of the present invention is the implementation of a method and a system for processing the pre-echoes of an audio-digital signal coded by MDCT transform in which the pre-echoes are substantially suppressed.

A further subject of the present invention is the implementation of a method and a system for processing the pre-echoes of an audio-digital signal coded by MDCT transform in which, no modification being made to the signal levels, before or after excitation, a virtually perfect reconstruction of the signal after decoding is thus obtained.

The method of processing the preechos of an audio-digital signal coded by frequency transform, which is the subject of the present invention, is notable in that it consists, after coding this signal by frequency transform as a coefficient y(k), over weighting windows formed over blocks of samples x(n) comprising N successive samples, in performing, on decoding the transform coefficients y(k), an optimal filtering, so as to reduce, when in the presence of a transition or variation in amplitude of the signal, the resulting additive noise when coding the quantization of the transform coefficients.

The system for processing the filtering pre-echoes of an audio-digital signal coded by frequency transform, which is the subject of the present invention, this system comprising, on the one hand, arranged in cascade at the level of the coder, a module reading the samples x(n) of audio-digital signal constituting these latter as block of N samples, a module for calculating the MDCT transform, delivering, on the basis of the said sample blocks, corresponding transform coefficients y(k), and a module for coding by quantizing these coefficients with a view to transmitting them by way of a digital transmission channel and, on the other hand, arranged in cascade at the level of the decoder, for reception of the transmission channel, a module for decoding the coefficients y(k) and a module for calculating the inverse MDCT$^{-1}$ transform, these modules constituting the decoder and delivering a noisy decoded signal x'(n), is notable in that it further comprises, on the one hand at the level of the coder, a module for detecting transitions labelled by the rank N-q of the transition in the current block under consideration, a module for extracting, from the sample blocks x(n), parameters of energy $\sigma^2$x(n) of the sample x(n) or of a group of successive samples of the original signal, a module for coding, from the parameters of energy $\sigma^2$x(n) of the sample x(n) or of the group of samples of the block of samples permitting the coded transmission of the parameters of energy $\sigma^2$x(n) and of a signal indicating the presence of a transition in the sample block under consideration and, on the other hand, at the level of the decoder, a module for reconstructing transmitted energy parameters $\alpha^2$x(n), a module for extracting the filtering parameters a1, a2, from the samples x(n) of the preceding block b-1 and for evaluating the energies of the coding noise $\sigma^2$b(n) and of the noise $\sigma^2$w(n) for the sample of rank n under consideration, a module for KALMAN filtering, receiving as filtering input the noisy decoded signal x'(n) and as control input said filtering parameters a1, a2 and the evaluation of the energies of the coding noise $\sigma^2$w(n), said filtering module delivering as output the filtered decoded signal xr(n).

The method and the system which are the subject of the present invention find application to the transmission of audio-digital signals, of high-fidelity quality, to the transmission, coding, decoding of audio-digital signals, and to all audio-digital signal transmission applications, such as the integrated services digital network ISDN.

BRIEF DESCRIPTION OF THE DRAWINGS

The method and the system which is the subject of the invention will be better understood on reading the description and looking at the drawings below in which: apart from FIGS. 1a to 1e relating to the prior art, FIG. 2a represents an illustrative diagram of the implementation of the coding method which is the subject of the invention, FIG. 2b represents an illustrative diagram of the implementation of the decoding method which is the subject of the invention.

DETAILED DESCRIPTION OF THE INVENTION

A more detailed description of the implementation of the method of processing the pre-echoes of an audio-digital signal, coded in non-limiting manner by MDCT transform, in accordance with the subject of the present invention, will be given in connection with FIG. 2a. Other types of frequency transforms can however be used without departing from the scope of the subject of the present invention.

Figure 1D:
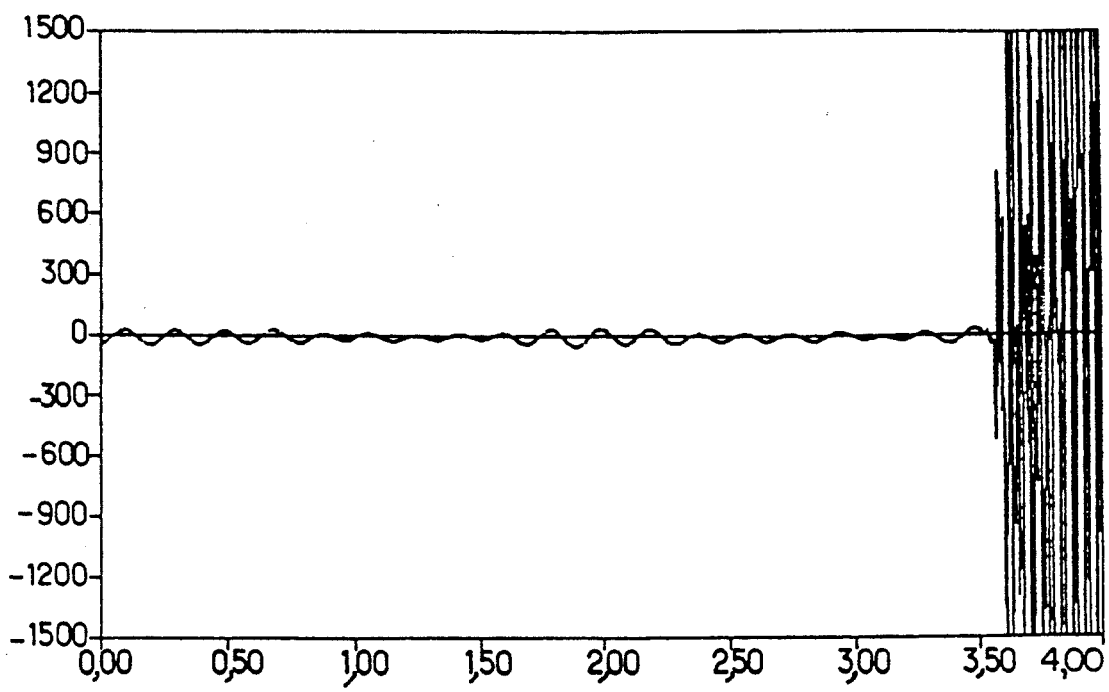
Figure 1E:
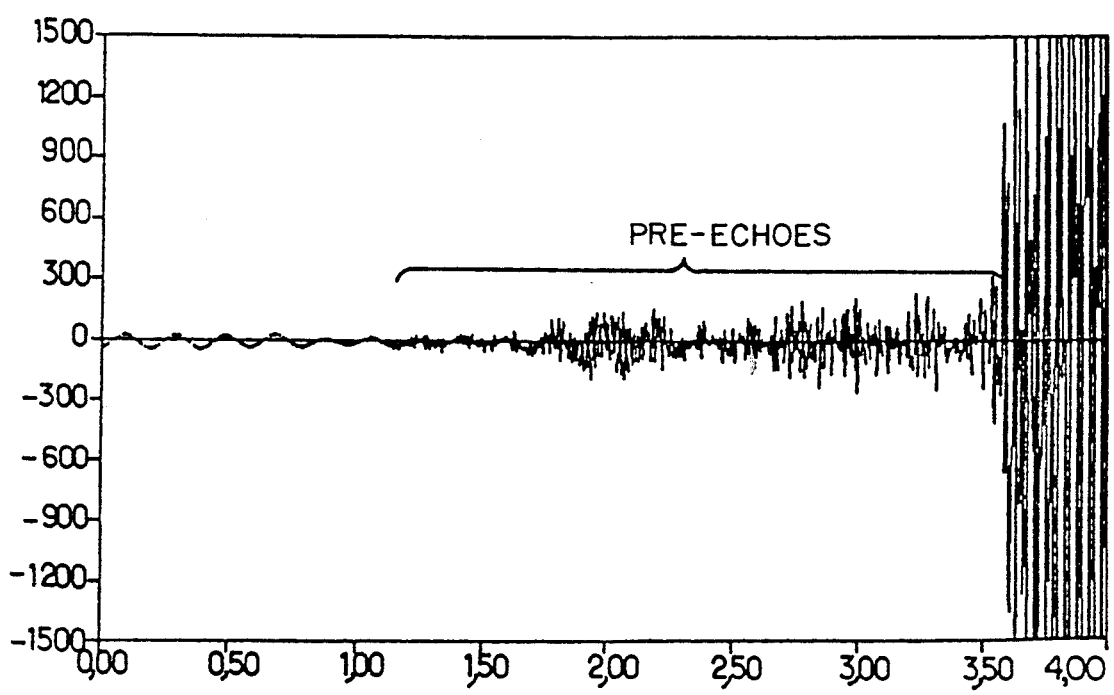

Conventionally, the method comprises steps of coding the audio-digital signal x(n), these samples being, through a procedure for reading samples configured into blocks, denoted x(n), these blocks comprising for example N successive samples, each block being subjected to a weighting window formed over these blocks, as represented for example in FIG. 1a. The abovementioned blocks are next subjected to MDCT transform processing, this transformation delivering the transform coefficients y(k). The abovementioned transform coefficients are next subjected to a coding procedure, denoted by H, this coding procedure delivering coded transform coefficients Cy(k) intended to be transmitted to and for the purposes of a decoding procedure.

Thus, as will be seen in FIG. 2b, the method which is the subject of the present invention consists in performing, on decoding the transform coefficients y(k), this decoding procedure being denoted by H$^{-1}$ at the level of the decoding proper, and more particularly following an inverse transformation procedure denoted by MDCT$^{-1}$ applied to the transform coefficient y(k) to obtain the samples x'(n) of rank n of the noisy decoded signal, an optimal filtering of these samples of the noisy decoded signal so as to reduce, when in the presence of a transition in amplitude of the audio-digital signal, the resulting additive noise during the coding of the quantization of the transform coefficients.

Generally, it will be noted that the presence of pre-echoes at the level of the coded audio-digital signal is in fact due to the degradation in the signal preceding the transition by introduction of additive noise b(n) resulting from the quantizing of the transform coefficients y(k).

Thus, the processing and reduction of this phenomenon, in accordance with the subject of the method according to the present invention, can be likened to a noise-reading problem which can be undertaken by means of an optimal filtering of the decoded audio-digital signal.

Thus, as has been represented in FIGS. 2a and 2b, the method which is the subject of the present invention entails, in a general way, at the level of the coding, a procedure for identifying the transition. Such an identifying can be performed in non-limiting manner by detecting such a transition in the current block under consideration, by creating for example a variable t representing the existence or non-existence of such a transition in the abovementioned block. Furthermore, and in advantageous, non-limiting manner, it will be possible to identify the transition in the current block under consideration by discriminating the position of the transition in the abovementioned block, that is to say in fact the abscissa M of the sample representing the first occurrence of this transition. It will finally be noted that, apart from identifying the transition in the block under consideration, the method which is the subject of the present invention also entails evaluating an energy parameter for each of the samples x(n), this energy parameter for each of the samples x(n) of the abovementioned audio-digital signal being denoted $\sigma^2 x(n)$.

Of course, the set of abovementioned parameters, parameters identifying the transition, is then transmitted on decoding in the form of the abovementioned parameter t of presence or absence of transition and of the parameter denoted C, M, which represent the coded parameters of the abscissa in the block of the transition and a parameter $C\sigma^2 x(n)$, which represents the coded energy parameter for each sample x(n) of the audio-digital signal, the set of the abovementioned parameters designated by the reference Cp then being transmitted to the decoding procedure together with the coded transform coefficients denoted Cy(k).

A particularly advantageous implementation of the method which is the subject of the invention can be effected bearing in mind the fact that the additive noise b(n) is non-stationary. Indeed, the energy of the abovementioned noise is higher for n close to the transition in the block under consideration than for the samples situated at the start of the block.

In accordance with the above remark, a particularly advantageous implementation of the method which is the subject of the present invention consists in carrying out the optimal filtering mentioned earlier in the form of a KALMAN filtering. The KALMAN filtering performed on decoding then makes it possible, in accordance with the method of the present invention, to obtain the reduction in the pre-echo phenomenon in a particularly satisfactory way, as will be described below in the description.

In general, it will be recalled that KALMAN filtering assumes a modelling of the expression for the audio-digital signals in the form of a state equation and an observation equation.

The state model is associated with the original signal x(n) whereas the observation equation describe the noisy decoded signal $x_r(n)$, that is to say affected by pre-echoes.

The state equation can be defined in auto-regression form of order p. The value of p must be chosen so as to secure a compromise between a sufficiently exact modelling of the sequence of samples of the audio-digital signal x(n) and a limited computational volume and load so as to secure a compatible real-time processing. For a more detailed description of this type of auto-regression definition reference can be made to the publication by Jayant and Noll entitled "Digital Coding of Waveforms", 1984, Prentice Hall Signal Processing series.

The matrix equations for the filtering are given by the relations:

$$X(n) = A \cdot X(n-1) + W(n)$$

-continued
$$x'(n) = C \cdot X(n) + b(n) \text{ with}$$

$$X(n) = \begin{bmatrix} x(n) \\ x(n-1) \\ x(n-2) \\ \ldots \\ x(n-p) \end{bmatrix}$$

$$C = [1, 0, 0 \ldots 0]$$

$$A = \begin{bmatrix} a1 & a2 & \ldots & ap \\ 1 & 0 & 0 & 0 \\ 0 & 1 & 0 & 0 \\ . & 0 & 1 & 0 \\ . & . & . & . \\ . & . & . & . \end{bmatrix}$$

$x'(n)$ and $b(n)$ being scalars.

The general equations for the filter can be written: estimation: $Xr(n) = A \cdot Xr(n-1) + K(n)(x'(n) - C \cdot A \cdot Xr(n-1))$ calculation of the gain:

$$K(n) = P1(n) \cdot C^T \cdot [C \cdot P1(n) \cdot C^T + \sigma b^2(n)]^{-1}$$

matrix of the prediction error: $P1(n) = A \cdot P(n-1) \cdot A^T + Q(n)$ with $$Q(n) = \begin{bmatrix} \sigma^2 w(n) & 0 & \ldots & 0 \\ 0 & 0 & & 0 \\ 0 & . & & 0 \\ . & . & & . \\ . & . & & . \end{bmatrix}$$

matrix of the estimation error: $P(n) = P1(n) - K(n) \cdot C \cdot P1(n)$

By way of non-limiting example, a value p=2 will be regarded as suitable for implementing the method which is the subject of the present invention. Under these conditions the state equation defined in regression form of order 2 can be written:

$$x(n) = a1 \cdot x(n-1) + a2 \cdot x(n-2) + w(n) \quad (1)$$

In the above relation, a1 and a2 designate the filter prediction coefficients and w(n) designates the amplitude of the innovation noise for the sample x(n) of rank n under consideration.

Furthermore, the observation relation or equation can be written on scalar form:

$$x'(n) = x(n) + b(n) \quad (2)$$

In the above relation, x(n) designates of course the original audio-digital signal, that is to say the current sample of order n under consideration, b(n) designating the amplitude of the coding noise or pre-echo for this same sample and $x_r(n)$ designates the sample of rank n of the noisy decoded signal, that is to say the sample obtained on decoding, as represented in FIG. 2b after inverse $MDCT^{-1}$ transformation.

The KALMAN filtering equations are known from the state of the art and given the modelling described earlier, the sample of rank n of the filtered decoded signal, that is to say obtained after optimal filtering by KALMAN filtering is given by the relation:

$$xr(n) = a1.(1-K1).xr(n-1) + a2(1-K1).xr(n-2) + K1.x'(n) \quad (3)$$

$$xr(n-1) = xr(n-1) + K2(x,(n) - (a1.xr(n-1) + a2.xr(n-2)))$$

In the above relation, K1, K2 designate the filter gain value satisfying the relation:

$$K1 = Pl(1)/(Pl(1) + \sigma^2 b(n)) \quad (4)$$

$$K2 = Pl(3)/(Pl(1) + \sigma^2 b(n)) \quad (5)$$

relations in which the coefficients Pl(1) and Pl(3) are given by the matrix of the prediction error and by the matrix of the estimation error of the KALMAN filtering.

It will be recalled to mind that the matrix of the prediction error is given by the relations:

$$Pl(1) = a1^2.P(1) + a1a2(P(2) + P(3)) + a2^2.P(4) + \sigma w^2(n) \quad (6)$$

$$Pl(2) = a1.P(1) + a2.P(3) \quad (7)$$

$$Pl(3) = a1.P(1) + a2.P(2) \quad (8)$$

$$Pl(4) = P(1) \quad (9)$$

Furthermore, the matrix of the estimation error is given by the relations:

$$P(1) = (1-K1).Pl(1) \quad (10)$$

$$P(2) = (1-K1).Pl(2) \quad (11)$$

$$P(3) = Pl(3) - K2.Pl(1) \quad (12)$$

$$P(4) = Pl(4) - K2.Pl(2) \quad (13)$$

The above equations are calculated for each value of n, for n lying, within the current block under consideration, between zero and M-1, where M-1 is the index of the sample immediately prior to the transition corresponding to the sample of order M, a sample for example for which an amplitude variation is greater than a ratio 4 for example.

It will be noted that in the case of a coding by MDCT transform the above equations must be applied to the two overlapping blocks in which the transition is present, that is to say the two corresponding overlapping blocks.

It will be noted that in the above relations, $\sigma^2 b(n)$ designates the energy of the coding noise and $\sigma^2 w(n)$ the energy of the innovation noise w(n) for the sample x(n) of rank n under consideration.

It will be noted that the above equations are established under the assumption that b(n) is regarded as white noise independent of x(n), these conditions of application being in general satisfied. Indeed, during the excitation, it is to say the appearance of the transition, the short-term spectrum resulting from the MDCT transform is substantially flat, and the same is true for that of the noise. Furthermore, it will be noticed that this noise depends largely on the most energetic portion of the signal, that is to say that situated after the transition, and consequently the noise b(n) is generally uncorrelated with the signal x(n) preceding the excitation proper.

Thus, in accordance with the method which is the subject of the present invention as represented in FIG. 2a, in the case where the optimal filtering is a KALMAN filtering, this method consists, during the coding procedure, in determining, on the one hand, the energy $\sigma^2 x(n)$ of the sample x(n) of the original signal and, on the other hand, the existence of a transition at the level of at least one sample x(N-q) of rank N-q of a current determined block, with:

$$N - q = M \quad (14)$$

The method according to the invention then consists, during the coding procedure, in transmitting at decoding level the value of the abovementioned energy parameters $\sigma^2 x(n)$ and parameters of existence of the transition as described earlier.

Then, the method, as represented in FIG. 2b, is the subject of the present invention consists, during the decoding procedure, in estimating the filtering parameters, that is to say the prediction coefficients a1, a2 of the filtering from the samples of the preceding block b-1, in accordance with the relations given earlier in the description. Similarly, the energies of the coding noise $\sigma^2 b(n)$ and of the noise $\sigma^2 w(n)$ for the sample of rank n under consideration are evaluated, this making it possible to secure, at the level of the decoding, the adaptive filtering of KALMAN filtering type of the noisy decoded signal x,(n) in order to reconstruct the filter decoded signal in which the pre-echoes are substantially suppressed.

Symbolically and in accordance with the method which is the subject of the present invention, the signal S obtained after decoding is given by the logic relation:

$$S = t.xr(n) + E.x'(n) \quad (15)$$

It will of course be understood that in the above relation, t takes the value 0 or 1 depending absence, or presence, respectively, of a transition in respect of the current block under consideration.

It will be understood that in a general way, in order to secure efficient implementation of the method which is the subject of the invention, certain parameters required in the filtering can be estimated at the level of the decoding, whereas the parameters intended to follow the non-stationarity of the original audio-digital signal x(n) must be evaluated at the level of the coding and then transmitted so as to secure the decoding and optimal filtering mentioned earlier.

Figure 3A:
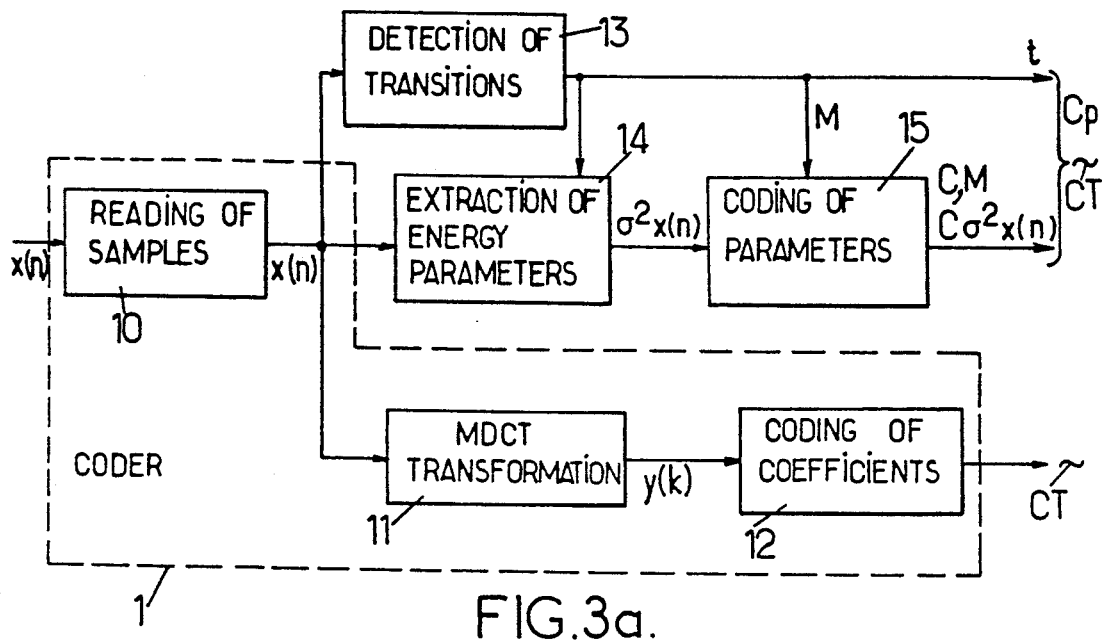
FIG. 3a represents an embodiment of the system according to the invention at the level of the coder of the samples by MDCT transform.

A more detailed description of a system for processing the pre-echoes of an audio-digital signal coded by frequency transform in accordance with the method which is the subject of the present invention will be given in connection with FIGS. 3a representing more particularly a coder and 3b representing by contrast a decoder making up the system according to the invention.

Figure 3B:
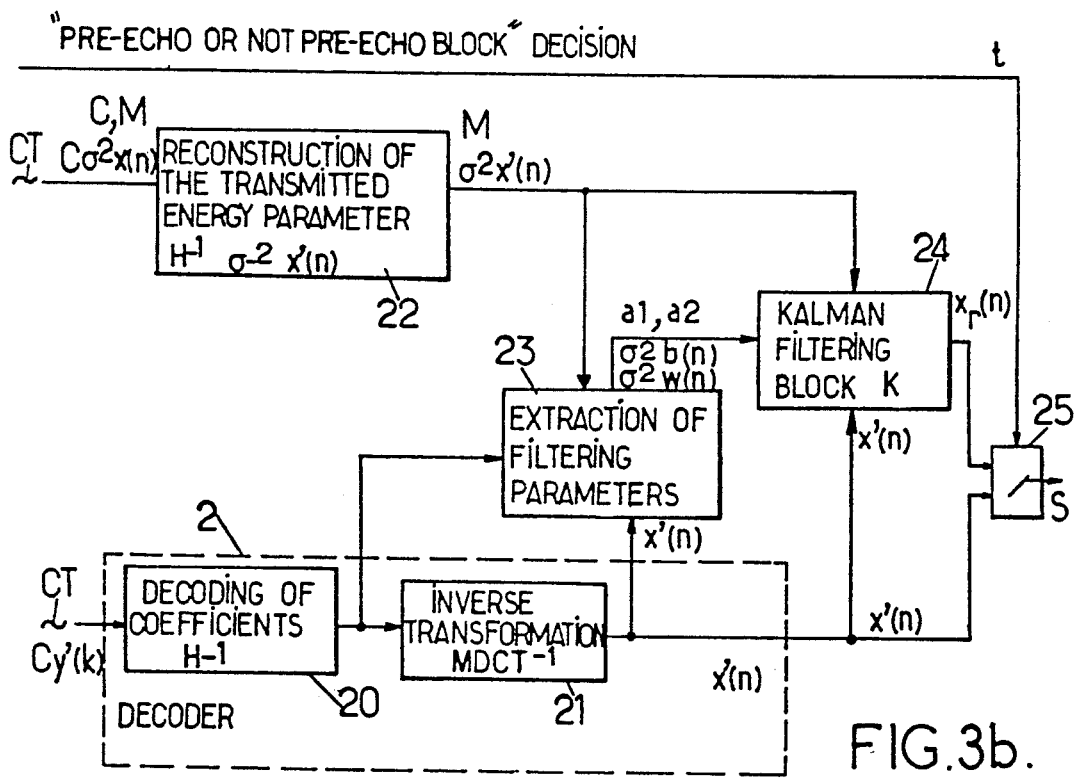
FIG. 3b represents an embodiment of the system according to the invention at the level of the decoder of decoded samples transmitted by inverse MDCT$^{-1}$ transforms.

Of course, FIGS. 3a and 3b are represented in block diagram form, the various block diagrams making it possible to carry out the steps of the method which is the subject of the present invention as embodied in FIGS. 2a and 2b.

Accordingly, as has been represented in FIG. 3a for example, the system comprises on the one hand, arranged in cascade at the level of the coder 1, a module 10 reading the samples x(n) of audio-digital signal constituting these latter as a block of N samples, a module 11 for calculating the MDCT transform, delivering on the basis of the said sample blocks corresponding transform coefficients y(k), and a module 12 for coding by quantizing these coefficients with a view to transmitting them by way of a digital transmission channel denoted CT in FIG. 3a. The digital transmission channel CT will not be described in detail since it corresponds to a transmission channel of conventional type.

Moreover, as has been represented in FIG. 3b, the system according to the invention comprises, on the other hand, arranged in cascade at the level of the decoder 2, for reception of the abovementioned transmission channel CT, a module 20 for decoding the coefficients y(k) and a module 21 for calculating the inverse $MDCT^{-1}$ transform, these modules constituting the decoder and delivering a noisy decoded signal x'(n).

According to the subject of the present invention, the system further comprises, at the level of the coder 1, a module 13 for detecting the transitions labelled by the rank N-q of the transition in the current block under consideration and a module 14 for extracting from the sample blocks x(n) the energy parameters $\sigma^2 x(n)$ of the current corresponding sample x(n) or of a group of successive samples of the original signal.

Finally, a module 15 is provided for coding from the energy parameters $\sigma^2 x(n)$ of the sample x(n) or of the group of samples of the sample block, this coding module making it possible to generate corresponding codes $C\sigma^2 x(n)$ and C,M in order to permit the coded transmission of the abovementioned parameters and of the signal t indicating the presence of a transmission in the current block by way of the transmission channel CT.

In regard to the transition-detection module 13 mentioned earlier, it will merely be indicated that the latter generates the indicator t which takes for example the value 1 on the case of a block containing a transition, that is to say liable to generate pre-echoes this indicator being simply coded with one bit and transmitted to the decoder. The module 13 also delivers the position of the transition in the block under consideration, that is to say the abscissa of the abovementioned point M. The address of the transition, M, is then delivered to the coding module 15 mentioned earlier and coded for example with $\log_2(N)$ bits where N is the size of the transform block for transmission in the form of the code C,M mentioned earlier.

It will be noted that the detection of the excitations can be carried out by examining the temporal waveform, for example comparing the value of the amplitude of the sample under consideration with a threshold value in the ratio 4 mentioned earlier, the transition detection module 13 receiving of course the samples x(n) of the block under consideration.

Other solutions can be envisaged for example comparison of the short-term spectrum of the block under consideration against that calculated over the preceding block.

Thus, as has further been represented in FIG. 3b, the system according to the invention comprises at the decoder 2 level a module 22 for reconstructing the transmitted energy parameters, this module receiving from the transmission channel CT the transition address C,M and energy $C\sigma^2 x(n)$ codes and delivers the corresponding address M and energy $\sigma^2 x(n)$ parameters. It will be noted that the module 22 makes it possible to reconstruct the parameters which are indispensable for filtering and which are unknown at the level of the decoder.

Furthermore, as represented in FIG. 3b, a module 23 for extracting the filtering parameters a1, a2 is provided before carrying out the evaluation of these parameters from the samples x(n) of the preceding sample block and for evaluating the energies of the coding noise $\sigma^2 b(n)$ and of the noise $\sigma^2 w(n)$ for the sample of rank n under consideration. It will be noted in general that the extraction of the abovementioned filtering parameters can be performed either from the noisy decoded signal x'(n) or from the quantized transform coefficients y'(k) delivered by the decoding module 20.

Finally, a KALMAN filtering module 24 is provided which receives as filtering input the noisy decoded signal x'(n) delivered by the $MDCT^{-1}$ inverse transformation module 21, this same filtering module 24 receiving as control input the filtering parameters a1, a2 and parameters of evaluation of the energies of the coding noise $\sigma^2 b(n)$ and of the noise $\sigma^2 w(n)$ delivered by the module 23 for extracting the abovementioned parameters. Furthermore, the filtering module 24 receives the reconstructed energy parameters delivered by the module 22 and transition address M. The filtering module 24 delivers as output the filtered decoded signal xr(n).

In non-limiting manner and according to an advantageous aspect of the system which is the subject of the present invention as represented in FIG. 3b, the decoder comprises at the output a controlled switch 25 which receives, on the one hand, on a first switching input, the filtered decoded signal xr(n) and, on a second switching input, the signal x'(n) delivered by the decoder and more particularly by the inverse transformation module 21. As switching control input, the controlled switch 25 receives the transition presence indicator t. The signal S delivered corresponds to that indicated in connection with FIG. 2.

A more detailed description of the module 23 for extracting the filtering parameter a1, a2 and for evaluating the coding noise $\sigma^2 b(n)$ and noise $\sigma^2 w(n)$ energies will be given in connection with FIG. 4.

Thus as represented in the abovementioned figure, the abovementioned module for extracting the filtering parameters 23 comprises in parallel with an input port for the samples x'(n) of the noisy decoded signal, a first path A for calculating the filtering a1, a2 and noise parameters $\sigma^2 w(n)$ for the sample of rank n under consideration and a second path B for calculating the coding noise $\sigma^2 b(n)$. The filtering a1, a2, noise $\sigma^2 w(n)$ and coding noise $\sigma^2 b(n)$ parameters are delivered to the KALMAN filtering module 24.

Figure 4B:
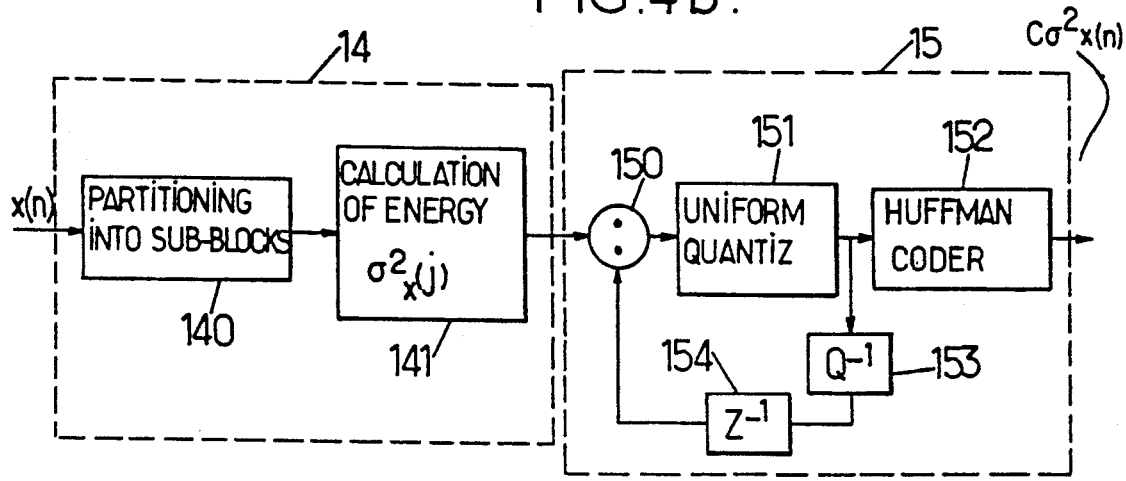
FIG. 4b represents a detail of embodiment of the circuits for estimating the energy parameters of the audio-digital samples x(n) at the level of the coder, as represented in FIG. 3a, FIG. 5a represents a timing diagram for samples representative of a guitar excitation signal sampled at 32 kHz.
Figure 4A:
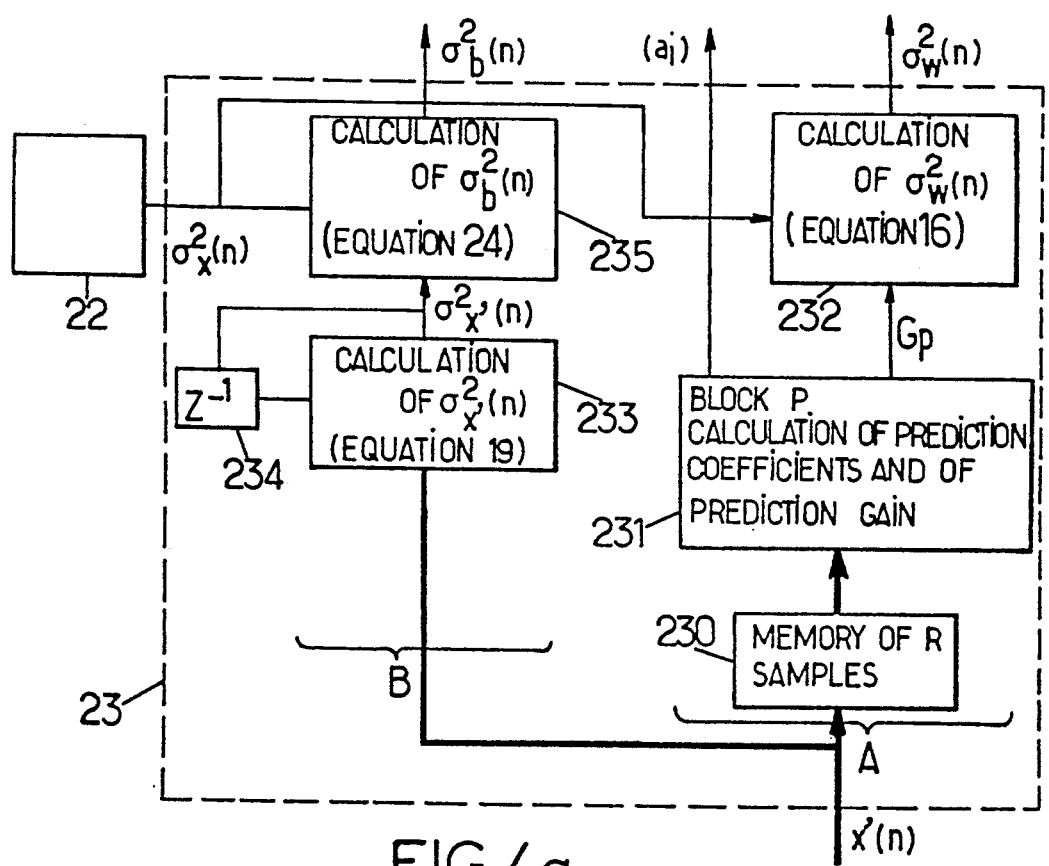
FIG. 4a represents a detail of embodiment of the circuits for extracting the optimal filtering parameters, KALMAN filtering, at the level of the decoder as represented in FIG. 3b.

The structure of the filtering parameter extraction module 23 as represented in FIG. 4a can be justified in the manner below.

The state equation given by relation (1) requires the knowledge of the prediction coefficients ai, that is to say a1, a2, when this state equation is defined in autoregressive form of order 2.

These coefficients must by contrast be calculated on the noiseless signal. Assuming that before the appearance of the excitation transition the signal is stationary, then the coefficients a1, a2 can be estimated at the level of the decoder from the reconstructed samples of the preceding block since these samples are not affected by the preecho phenomenon.

Thus, the first path A for calculating the filtering parameters comprises a sample memory 230 receiving the noisy samples x'(n) delivered by the inverse transformation module 21. With each block on termination of the decoding, the R latest samples are preserved in memory at the level of the memory 230. For a block size N=1024 for example, it is possible to take R=256. These R samples serve as input to the device for calculating the prediction coefficients. Accordingly the first path A comprises a circuit 231 for calculating the prediction coefficients ai or more precisely a1, a2 and the prediction gain Gp. The R samples placed in memory at the level of the memory 230 serve as input to the device for calculating the prediction coefficients if the following block is detected as being a block with pre-echo, that is to say for t=1.

The calculating circuit 231 can for example consist of a digital calculating circuit permitting calculation of the abovementioned coefficients by means of a Levinson algorithm. The abovementioned Levinson algorithm will not be described since this algorithm is known in the state of the art. The prediction coefficients a1, a2 or more generally ai constitute one of the inputs of the filtering module 24. These coefficients are assumed to be constant over the duration of the preecho.

Furthermore, the first path A comprises in cascade with the circuit 231 for calculating the prediction coefficients and prediction gain Gp a circuit 232 for calculating the variance of the innovation noise $\sigma^2 w(n)$. This circuit receives, on the one hand, the reconstructed value of the transmitted sample's energy parameter $\sigma^2 x'(n)$ delivered by the corresponding module 22 and the prediction gain Gp. The variance of the noise $\sigma^2 w(n)$ satisfies the relation given by the auto-regression model: $\sigma^2 w(n)$ satisfies the relation given by the auto-regression model:

$$\sigma^2 w(n) = \sigma^2 x(n)/G_p \tag{16}$$

In this relation $\sigma^2 x(n)$ is the energy of the original noiseless audio-digital signal, Gp representing the prediction gain associated with the auto-regression model.

Clearly, calculation of the gain $G_p$ can be performed at the level of the circuit 231 on the basis of the prediction coefficients a1 and a2 or more generally ai. A usable calculation method is described by Jayant and Noll in the work Digital Coding of Waveforms 1984, Prentice Hall, Signal Processing Series page 263.

Thus, as has furthermore been represented in FIG. 4a, the second path B comprises in succession connected in cascade a circuit 233 for calculating the energy parameter $\sigma^2 x'(n)$ of the noisy sample x'(n). The calculating circuit 233 is followed by a circuit 235 for calculating the coding noise parameter $\sigma^2 b(n)$ for the samples.

The coding noise energy $\sigma^2 b(n)$ can be deduced from the energies of the original noiseless signals $\sigma^2 x(n)$ and of the noisy signal $\sigma^2 x,(n)$ of the noisy signal x'(n).

Indeed, under the assumption of complete uncorrelation between the original signal and coding noise b(n), it is possible to write:

$$\sigma^2 x'(n) = \sigma^2 x(n) + \sigma^2 b(n) \tag{17}$$

$$\sigma^2 b(n) = \sigma^2 x'(n) - \sigma^2 x(n) \tag{18}$$

It will be noted that the energies of the original and noisy audio-digital signals can be evaluated in various ways.

For example, the energy of the noise signal $\sigma^2 x'(n)$ can be calculated at the level of the decoder with the aid of a recurrence equation of the form:

$$\sigma^2 x'(n) = a.\sigma^2 x'(n-1) + (1-a).x'^2(n) \tag{19}$$

In this equation $a$ is a constant lying between 0 and 1 and can for example be taken equal to 0.95. For this purpose, with the calculating circuit 233 is associated a delay circuit 234 which restores the value $\sigma^2 x'(n-1)$ relating to the sample of order n−1 of the noisy signal x'(n-1). Of course, the circuit 233 for calculating the energy parameter $\sigma^2 x'(n)$ then permits determination of the present value of the energy of the noisy sample $\sigma^2 x'(n)$ according to relation 19.

The value of the energy of the noiseless sample $\sigma^2 x(n)$ is, it will be recalled, calculated at the level of the coder, transmitted to the decoder and delivered by the corresponding circuit 22. It is possible to regard $\sigma^2 x(n)$ as constant throughout the duration of the pre-echo, this making it possible to transmit thereby just a single corresponding value per sample block.

However, as will be noted on looking at FIG. 1c I for example, the signal preceding the excitation, that is to say the appearance of the transition, may contain relatively sizeable energy variations of which the previously described filtering device must be informed.

For this purpose, a more detailed description of the module 14 for extracting the energy parameters at the level of the coder will be given in connection with FIG. 4b.

According to the above figure, the module 14 comprises a module 140 for partitioning each block b of N samples into sub-blocks of a determined number of successive samples. Thus, the module 140 performs this partitioning into sub-blocks of dimension L. The value of the parameter L can be chosen so that the local energy variations can be isolated within a sub-block. By way of non-limiting example, for a sampling frequency equal to 32 KHz, the value of L can be taken equal to L=128.

The processing of the pre-echoes by filtering is then performed over R=E[M/L] sub-blocks of L samples, where the notation E[.] signifies integer part. It will be noted that the M-r.L latest samples preceding the transition can be not filtered. Indeed, owing to the time-masking properties and in respect of a sufficiently small value of L, the noise which affects them is not audible. A more detailed description of the effects of time masking can be found in the work published by Zwicker entitled "Psycho-acoustique, l'oreille récepteur d'information" published by MASSON, Paris, 1981.

In each of the M/L sub-blocks, the energy parameter $\sigma^2 x(n)$ can be calculated by means of the relation:

$$\sigma^2 x(j) = (1/L) \cdot \sum_{l=j\cdot L}^{(j+1)L-1} x^2(l) \tag{20}$$

In this relation j represents the index of the sub-block from the set thus constituted of M/L sub-blocks, $0 \leq j \leq M/L-1$.

The above calculation is performed by means of the module 141 for calculating the energy $\sigma^2 x(j)$ which receives the various sub-blocks delivered by the module 140 described earlier.

The set $[\sigma x^2(j)]$ of energy parameters $\sigma^2 x(j)$ is coded and transmitted to the decoder by way of the coding module 15.

According to the embodiment of FIG. 4b, the coding of the abovementioned energy parameters can for example be carried out in accordance with the embodiment of this figure by quantizing the successive ratios.

For this purpose, the coding module advantageously comprises in succession a divider 150 receiving the energy parameters $\sigma^2 x(j)$ described earlier, a uniform quantizer 151 and a Huffmann coder 152. The output of the uniform quantizer 151 is furthermore looped back to an input of the divider 150 by way of an inverse quantizing circuit 153 followed by a circuit 154 for delaying a sample.

It will be noted that the divider 150 thus delivers to the uniform quantizer 151 the values of the successive ratios e(j) given by the relation:

$$e(j) = \sigma^2 x(j) / \sigma^2 x(j-1) \qquad (21)$$

These ratios can be quantized by the abovementioned uniform quantizer consisting of a quantizer with a small number of levels. The code words output by the uniform quantizer 151 can then undergo an entropy coding for example, a Hoffmann coding by means of the coder 152.

Other techniques such as vector quantization can however be used. Coding module 15 then delivers the corresponding code $C\sigma^2 x(n)$ for transmission by the transmission channel CT described earlier.

At the level of the decoder, in particular at the level of the module 23 for extracting the filtering parameters a1, a2, as represented in FIG. 4a, the energy of the coding noise $\sigma^2 b(n)$ is given by the relation:

$$\sigma^2 b(n) = \sigma^2 x'(n) - \sigma^2 x'(j) \qquad (22)$$

In this relation the indices j, n are related by the equation: $j.L \leq n \leq (j+1).L-1$.

In the above relation (22), it will be noted in particular that $\sigma^2 x'(j)$ is the quantized version of $\sigma^2 x(j)$ in the sub-block j received at the decoder and $\sigma^2 x'(n)$ is estimated by equation (19) described earlier.

In order to have available an estimate of smoothed noise delivered by the module 23, in particular at the junction of the sub-blocks into n=j.L a recurrence equation of the same type. as equation 19 can be used, the value of smoothed noise satisfying the relation:

$$\sigma^2 b(n) = \beta.\sigma^2 b(n)-1) + (1-\beta)(\sigma^2 x'(n) - \sigma^2 x'(j)) \qquad (23)$$

zero and one having for example a value $\beta=0.85$.

The first value $\sigma^2 x(0)$ permitting initialization of the recurrence form given by relation 24 must be coded with respect to a variable common to the decoder 1 and to the decoder 2.

By way of non-limiting example, this can be the energy of the preceding block estimated through the sum of the energies of the quantized transform coefficients y'(k). Under such an assumption, the ratio e(0) satisfies the relation:

$$e(0) = \sigma^2 x(0) / \rho^2 x \qquad (24)$$

In the above relation $$\Sigma x^2 = \rho y'^2(k). \qquad (25)$$

In the preceding relation, the terms $y'^2(k)$ are the quantized coefficients of the preceding block. Indeed, in accordance with Parseval's relation, $\rho^2 x = \sigma^2 x$ to within the coding noise. However, in the case of a coder using the MDCT transform, Parseval's relation is not satisfied, however owing to the particular nature of this transform the term $\rho^2 x$ can be approximated by:

$$\rho^2 x = 4.\Sigma y'^2(k) \qquad (26)$$

The method and the system of the present invention make it possible to obtain particularly notable results since they make it possible to obtain a large reduction in the pre-echoes.

Figure 5A:
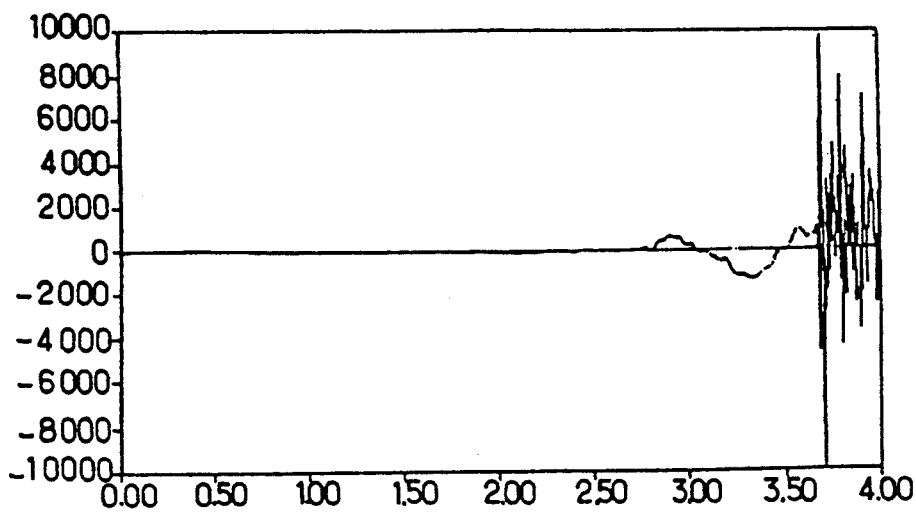
FIG. 5b represents a timing diagram for samples representative of the guitar excitation signal coded by MDCT transform without processing of the pre-echoes with a transmission throughput of 64 kbits/s.
FIG. 5c represents a timing diagram for samples representative of the guitar excitation signal coded with processing of the echoes by means of the method and system which are the subject of the present invention.

FIG. 5a represents the original signal of a guitar excitation sampled at 32 KHz over a duration of 32 msec. The amplitude axis is graduated in terms of relative amplitude value, this making it possible to observe, at the level of the samples immediately prior to the transition proper, a large amplitude variation as compared with the samples of the same block at the start of the latter.

Figure 5B:
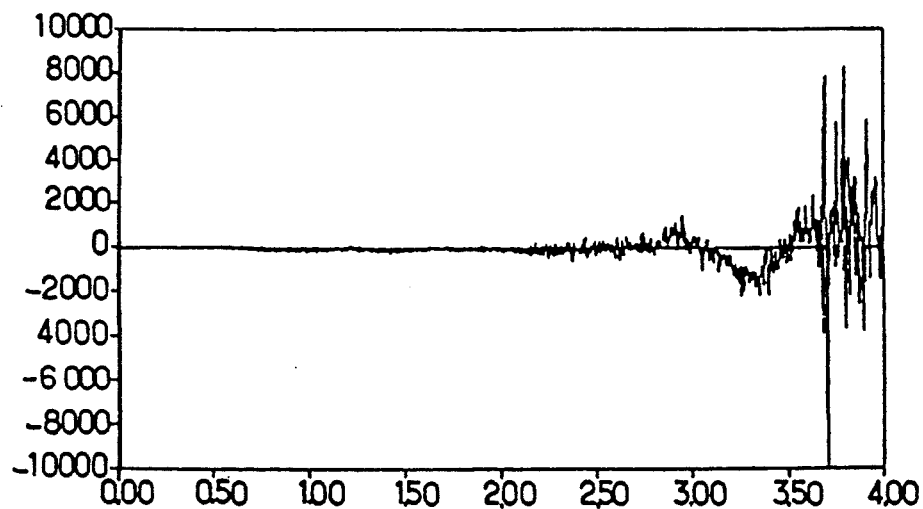

In contrast FIG. 5b represents the coded signal without pre-echo processing, the coding being performed by means of a MDCT transformer and transmission being performed with a throughput of 64 Kb/s. Thus, as will be noted on looking at FIG. 5b, the preecho phenomenon is very apparent, insofar as the preecho noise, on the same samples immediately prior to the transition itself, exhibit a peak-to-peak amplitude 4 to 5 times greater than the amplitude of the noise level of the samples present at the corresponding start of block.

Figure 5C:
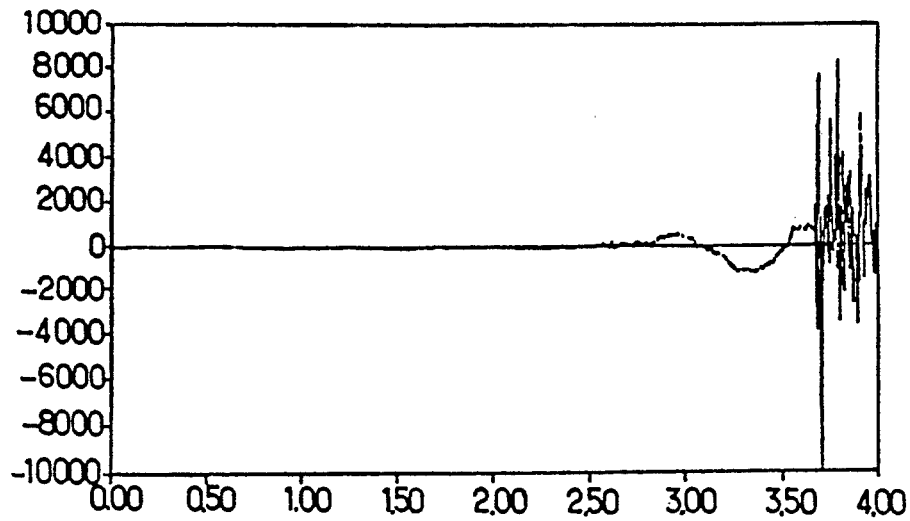

FIG. 5c represents the coded signal with pre-echo processing and it is observed that the pre-echo noise has nearly disappeared in order to give a signal signature nearly similar to that of FIG. 5a. Of course, in FIGS. 5a–5c, the axes are graduated according to the same relative value units so as to give a correct appreciation of the reduction in the level thus obtained of the pre-echoes.

Owing to the adaptive character of the method and of the system which are the subject of the present, invention, the reduction in the level of the pre-echoes is particularly powerful in respect of any type of signal. The improvement in the quality which results from this is particularly noticeable above all when the coder uses an MDCT transform, without there being for all that a noticeable increase in the delay of the coding system. It will indeed be understood that the processing, both at the level of coding and at the level of decoding, is performed in real time, transmission of the noise-freed samples being thus performed in real time to within time for transmission and processing of a block.

I claim:

1. A method of processing pre-echoes of an audio-digital signal, said audio-digital signal comprising of blocks comprising N successive samples which are transformed by a frequency transform into transform coefficients y(k) over weighting windows formed over said blocks, said transform coefficients being transmitted and decoded, said method comprising, for the coding-decoding procedure of each sample x(n) of a current block, the steps of:

coding said transform coefficients y(k) by quantization;

determining the energy $\sigma^2 x(n)$ of sample x(n) of said audio-digital signal;

detecting a transition in amplitude of said audio-digital signal at the level of at least one sample x(N-q) of rank N-q of said current block;

coding said energy $\sigma^2 x(n)$ and a position of said transition in said current block;

transmitting a transition indicator and the coded values for said energy, said position of said transition, and said transform coefficients;

decoding said transmitted transform coefficients;

reconstructing said transmitted energy $\sigma^2 x(n)$ and said transmitted position of said transition;

inversely transforming said decoded transform coefficients, resulting in a noisy decoded signal x'(n); and performing an optimal KALMAN filtering on one of said decoded transform coefficient y(k) and said noisy decoded signal x'(n) using said reconstructed energy $\sigma^2 x(n)$ and said reconstructed position of said transition, thereby resulting in a filtered decoded signal xr(n).

2. The method as claimed in claim 1, further comprising the step of selecting between said noisy decoded signal and said filtered decoded signal in accordance with said transition indicator.

3. The method as claimed in claim 1, wherein said KALMAN filtering step comprises the steps of:

calculating a state equation defined in regression form of order 2 of the form:

$$x(n) - a1.x(n-1) + a2.x(-2) + w(n)$$

where a1 and a2 designate the filter prediction coefficients and w(n) the innovation noise for said sample x(n) of rank n under consideration;

calculating an observation relation of the form:

$$x'(n) = x(n) + b(n)$$

where b(n) designates the amplitude of the coding noise of pre-echo for sample x(n); x'(n) designates said noisy decoded signal for said sample; and calculating said sample of rank n of the filtered decoded signal by the relation;

$$xr(n) = a1.(1 - K1).xr(n-1) + a2.(1-K1).xr(n-2) + K1.x'(n)$$

where K1 designates the filter gain value satisfying the relations:

$$K1 = P1(1)/[P1(1) + \sigma^2 b(n)]$$

K2 in which the coefficients P1(1) and P1(3) are given by the matrix of the prediction error and by the matrix of the estimation error of the KALMAN filtering; $\sigma^2 b(n)$ designates the energy of the coding noise; and $\sigma^2 w(n)$ designates the energy of said innovation noise w(n) for said sample x(n) of rank (n), and wherein said method, prior to said KALMAN filtering step, further comprises:

estimating said filter prediction coefficients a1 and a2 on the basis of the samples x(n-1) from the preceding block; and evaluating the energies of the coding noise $\sigma^2 b(n)$ and of the innovation noise $\sigma^2 w(n)$ for said sample x(n).

4. A system for processing the pre-echoes of an audio-digital signal, said audio-digital signal comprising blocks comprising N successive samples, said blocks being transformed by a frequency transform into transform coefficients y(k) over weighting windows formed over said blocks, said system comprising:

a coder including a plurality of modules arranged in cascade, said coder comprising:

a module for reading said samples x(n) of said audio-digital signal, a module for receiving said read samples, for calculating said frequency transform and for outputting a corresponding transform coefficient y(k) for each current sample block, a module for receiving said read samples, for detecting a transition in amplitude of said audio-digital signal at the level of at least one sample of rank (N-q) of said current sample block and for outputting a transition indicator and a position of said transition in said current block, a module for receiving said read samples, and for extracting, from said samples x(n), parameters of energy $\sigma^2 x(n)$ of each sample or of a group of successive samples of said current sample block of said audio-digital signal, a module for coding by quantizing said transform coefficients, and a module for coding said parameters of energy $\sigma^2 x(n)$, and said position of said transition;

a digital transmission channel transmitting said transition indicator and coded values of said transform coefficients, said parameters of energy $\sigma^2 x(n)$, and said position of said transition; and a decoder including a plurality of modules arranged in cascade for receiving said coded values and said transition indicator from said transmission channel, said decoder comprising:

a module for decoding said transmitted transform coefficients y(k), a module for calculating the inverse frequency transform of decoded transform coefficients, and for outputting a noisy decoded signal x'(n), a module for reconstructing said transmitted coded parameters of energy $\sigma^2 x(n)$ and position of said transition, a module for receiving said noisy decoded signal x'(n) and said reconstructed parameters of energy $\sigma^2 x(n)$, for extracting prediction coefficients of said samples x(n) of the block of samples x(n-1) preceding said current sample block and for evaluating the energies of the innovation noise $\sigma^2 w(n)$ and of the coding noise $\sigma^2 b(n)$ for said sample x(n) of rank n of said current sample block, and a KALMAN filtering module for receiving as a filtering input said noisy decoded signal x'(n) and as a control input said prediction coefficients and said energies of said coding noise $\sigma^2 b(n)$ and said innovation noise $\sigma^2 w(n)$, and for outputting a filtered decoded signal xr(n), thereby reducing the resulting additive noise when coding the quantization of said transform coefficients.

5. The system as claimed in claim 4, wherein said module for extracting the parameters of energy $\sigma^2 x(n)$ of the samples x(n) of the signal comprises, arranged in cascade:

a module for partitioning each said block of N samples into sub-blocks of a determined number of successive samples; and a module for calculating the energy $\sigma^2x(j)$ of a sample or of a group of samples of said audio-digital signal.

6. The system as claimed in claim 4, wherein said module for coding said parameters of energy comprises:
- a uniform quantizer receiving from said parameters of energy, code words; and
- a Huffmann coding circuit receiving said code words and outputting said coded parameters of energy.

7. The system as claimed in claim 4, wherein said module for extracting the prediction coefficients and for evaluating the energies of the coding noise $\sigma^2b(n)$ and of the innovation noise $\sigma^2w(n)$ comprises in parallel with an input port for the samples x'(n) of the noise decoded signal:
- a first path for calculating said prediction coefficients and the energy of the innovation noise $\sigma^2w(n)$ for the sample of rank n under consideration; and
- a second path for calculating the energy of the coding noise $\sigma^2b(n)$.

8. The system as claimed in claim 7, wherein said first path comprises in succession connected in cascade:
- a sample memory for receiving the noisy samples x'(n) delivered by said module for calculating the inverse frequency transform;
- a circuit for calculating said prediction coefficients and a prediction gain Gp; and
- a circuit for calculating the variance of the sample innovation noise $\sigma^2w(n)$ and
- for receiving said reconstructed parameters of energy $\sigma^2x(n)$ and said prediction gain Gp, and for calculating the energy of the innovation noise satisfying the relation:

$$\sigma^2w(n) = \frac{\sigma^2x(n)}{Gp}.$$

9. The system as claimed in claim 7, wherein said second path comprises in succession connected in cascade:
- a circuit for calculating the energy parameter $\sigma^2x'(n)$ of the noisy sample x'(n), said energy parameter satisfying a recurrence relation of the form: $\sigma^2x'(n)=a.\sigma^2x'(n-1)+(1-a).x'^2(n)$, where a is a constant with value lying between zero and one; and
- a circuit for receiving said reconstructed parameters of energy $\sigma^2x(n)$ and said energy parameter $\sigma^2x'(n)$ of the noisy sample, and for calculating the energy of the coding noise $\sigma^2b(n)$ for the samples, said energy of the coding noise satisfying a relation of the form:

$$\sigma^2b(n)=\sigma^2x'(n)-\sigma^2x(n).$$

10. The system as claimed in claim 4, further comprising a two-path switch for receiving said transition indicator, said switch including a first path receiving said filtered decoded signal xr(n) and a second path receiving said noisy decoded signal x'(n), and said switch outputting said filtered decoded signal when said transition indicator indicates the presence of a transition in said current sample block and outputting said noisy decoded signal when said transition indicator indicates the absence of a transition in said current sample block.

* * * * *